United States Patent
Lee et al.

(10) Patent No.: US 10,985,774 B2
(45) Date of Patent: Apr. 20, 2021

(54) DELTA-SIGMA MODULATOR AND ANALOG-TO-DIGITAL CONVERTER INCLUDING THE SAME

(71) Applicant: Gwanak Analog CO., LTD., Seoul (KR)

(72) Inventors: Byunggyu Lee, Seoul (KR); Youngtae Yang, Seoul (KR)

(73) Assignee: Gwanak Analog CO., LTD., Seoul (KR)

( * ) Notice: Subject to any disclaimer, the term of this patent is extended or adjusted under 35 U.S.C. 154(b) by 0 days.

(21) Appl. No.: 16/919,894

(22) Filed: Jul. 2, 2020

(65) Prior Publication Data

US 2021/0006260 A1    Jan. 7, 2021

(30) Foreign Application Priority Data

Jul. 3, 2019   (KR) .................. 10-2019-0080297

(51) Int. Cl.
    *H03M 3/00*    (2006.01)
    *H03M 1/12*    (2006.01)

(52) U.S. Cl.
    CPC .......... *H03M 3/496* (2013.01); *H03M 3/422* (2013.01); *H03M 3/462* (2013.01); *H03M 1/129* (2013.01); *H03M 3/478* (2013.01); *H03M 3/494* (2013.01)

(58) Field of Classification Search
    CPC ...... H03M 3/496; H03M 3/422; H03M 3/462; H03M 3/478; H03M 1/129; H03M 3/494
    USPC ................................................ 341/143, 155
    See application file for complete search history.

(56) References Cited

U.S. PATENT DOCUMENTS

| 7,994,958 | B2* | 8/2011 | Quiquempoix ......... H03M 3/34 341/150 |
| 8,907,829 | B1* | 12/2014 | Naderi .................. H03M 3/496 341/143 |
| 9,748,969 | B1 | 8/2017 | Bach et al. |
| 10,181,857 | B1 | 1/2019 | Trifonov |

FOREIGN PATENT DOCUMENTS

| KR | 1020120032471 A | 4/2012 |
| KR | 1020150127605 A | 11/2015 |
| KR | 1020160061808 A | 6/2016 |
| KR | 101923829 B1 | 11/2018 |

OTHER PUBLICATIONS

Jaehoon Jun et al., "A 386-uW, 15.2-bit Programmable-Gain Embedded Delta-Sigma ADC for Sensor Applications," In Proceedings of the IEEE International Symposium on Low Power Electronics and Design, Aug. 8-10, 2016, San Francisco Airport, CA, USA.
Shanthi Pavan et al., Understanding Delta-Sigma Data Converter 2nd Edition, IEEE Press Series on Microelectronic Systems, Jan. 2017, p. 171-172, Wiley-IEEE press.

* cited by examiner

*Primary Examiner* — Khai M Nguyen
(74) *Attorney, Agent, or Firm* — William Park & Associates Ltd.

(57) ABSTRACT

A delta-sigma modulator generates a bitstream signal from a differential input signal including a first input signal and a second input signal by repeating a first operation and a second operation alternately. The delta-sigma modulator includes a first sampling capacitor, a second sampling capacitor, a third sampling capacitor, a fourth sampling capacitor, an operational amplifier, a first feedback capacitor, a second feedback capacitor, and a quantizer.

14 Claims, 4 Drawing Sheets

DELTA-SIGMA MODULATOR AND ANALOG-TO-DIGITAL CONVERTER INCLUDING THE SAME

CROSS-REFERENCE TO RELATED APPLICATIONS

This application claims priority under 35 U.S.C. § 119(a) to Korean Patent Application No. 10-2019-0080297, filed on Jul. 3, 2019, which is incorporated herein by reference in its entirety.

BACKGROUND

1. Technical Field

Various embodiments generally relate to a delta-sigma modulator and an analog-to-digital converter (ADC) including the same, and more particularly, to a delta-sigma modulator having improved conversion performance and an ADC including the same.

2. Related Art

An analog-to-digital converter (ADC) converts an analog sensor signal output from a sensor into a digital signal.

When the sensor signal is very small, it is common to amplify the sensor signal before providing it to the ADC.

In this case, because a separate amplifier to amplify the sensor signal should be included in a sensor system, size and manufacturing cost of the sensor system increases.

Accordingly, there is a need for a technique for improving conversion performance without using a separate amplifier.

SUMMARY

In accordance with the present teachings, a delta-sigma modulator generating a bitstream signal from a differential input signal including a first input signal and a second input signal by repeating a first operation and a second operation alternately, the delta-sigma modulator may include a first sampling capacitor including a first terminal coupled to a first input signal during the first operation and coupled to a first feedback signal during the second operation; a second sampling capacitor including a first terminal coupled to the first input signal during the first operation and coupled to a second input signal during the second operation; a third sampling capacitor including a first terminal coupled to the second input signal during the first operation and coupled to the second input signal during the second operation; a fourth sampling capacitor including a first terminal coupled to the second input signal during the first operation and coupled to the first input signal during the second operation; an operational amplifier including a first input terminal commonly coupled to a second terminal of the first sampling capacitor and a second terminal of the second sampling capacitor during the second operation and a second input terminal coupled to a second terminal of the third sampling capacitor and a second terminal of the fourth sampling capacitor during the second operation; a first feedback capacitor coupled between the first input terminal and one of a differential output terminal; a second feedback capacitor coupled between the second input terminal and the other of the differential output terminal; and a quantizer configured to generate the bitstream signal from signals of the differential output terminal.

In accordance with the present teachings, an analog-to-digital converter (ADC) may include a delta-sigma modulator configured to generate a bitstream signal from a differential input signal including a first input signal and a second input signal by repeating a first operation and a second operation alternately; and a decimation filter configured to generate a digital signal corresponding to the differential input signal by filtering the bitstream signal, wherein the delta-sigma modulator may include a first sampling capacitor including a first terminal coupled to a first input signal during the first operation and coupled to a first feedback signal during the second operation; a second sampling capacitor including a first terminal coupled to the first input signal during the first operation and coupled to a second input signal during the second operation; a third sampling capacitor including a first terminal coupled to the second input signal during the first operation and coupled to the second input signal during the second operation; a fourth sampling capacitor including a first terminal coupled to the second input signal during the first operation and coupled to the first input signal during the second operation; an operational amplifier including a first input terminal commonly coupled to a second terminal of the first sampling capacitor and a second terminal of the second sampling capacitor during the second operation and a second input terminal coupled to a second terminal of the third sampling capacitor and a second terminal of the fourth sampling capacitor during the second operation; a first feedback capacitor coupled between the first input terminal and one of a differential output terminal; a second feedback capacitor coupled between the second input terminal and the other of the differential output terminal; and a quantizer configured to generate the bitstream signal from signals of the differential output terminal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
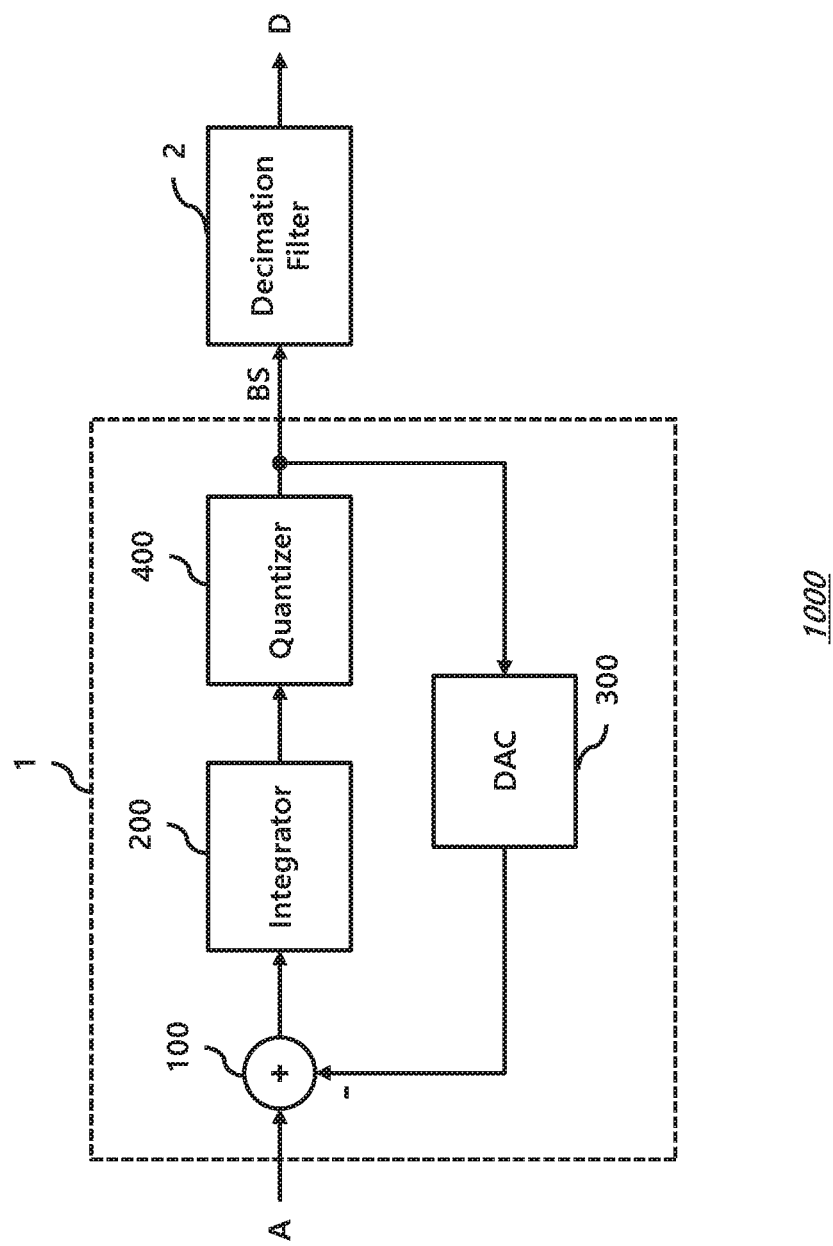
FIG. 1 is a block diagram illustrating an analog-to-digital converter according to an embodiment of the present disclosure.

FIG. 1 is a block diagram of an analog-to-digital converter (ADC) 1000 according to an embodiment of the present disclosure.

The ADC 1000 includes a delta-sigma modulator 1 and a decimation filter 2 that filters a bitstream signal BS output from the delta-sigma modulator 1 to generate a digital signal D.

The delta-sigma modulator 1 includes a subtractor 100, an integrator 200, a digital-to-analog converter (DAC) 300, and a quantizer 400.

The subtractor 100 generates a difference signal between an analog signal A and an output signal from the DAC 300, the integrator integrates the difference signal from the subtractor 100, and the quantizer 400 integrates an output from the integrator 200 and outputs the bitstream signal BS.

The delta sigma modulator 1 is widely used in ADCs because it can obtain relatively high resolution even at low operating speeds.

Figure 2:
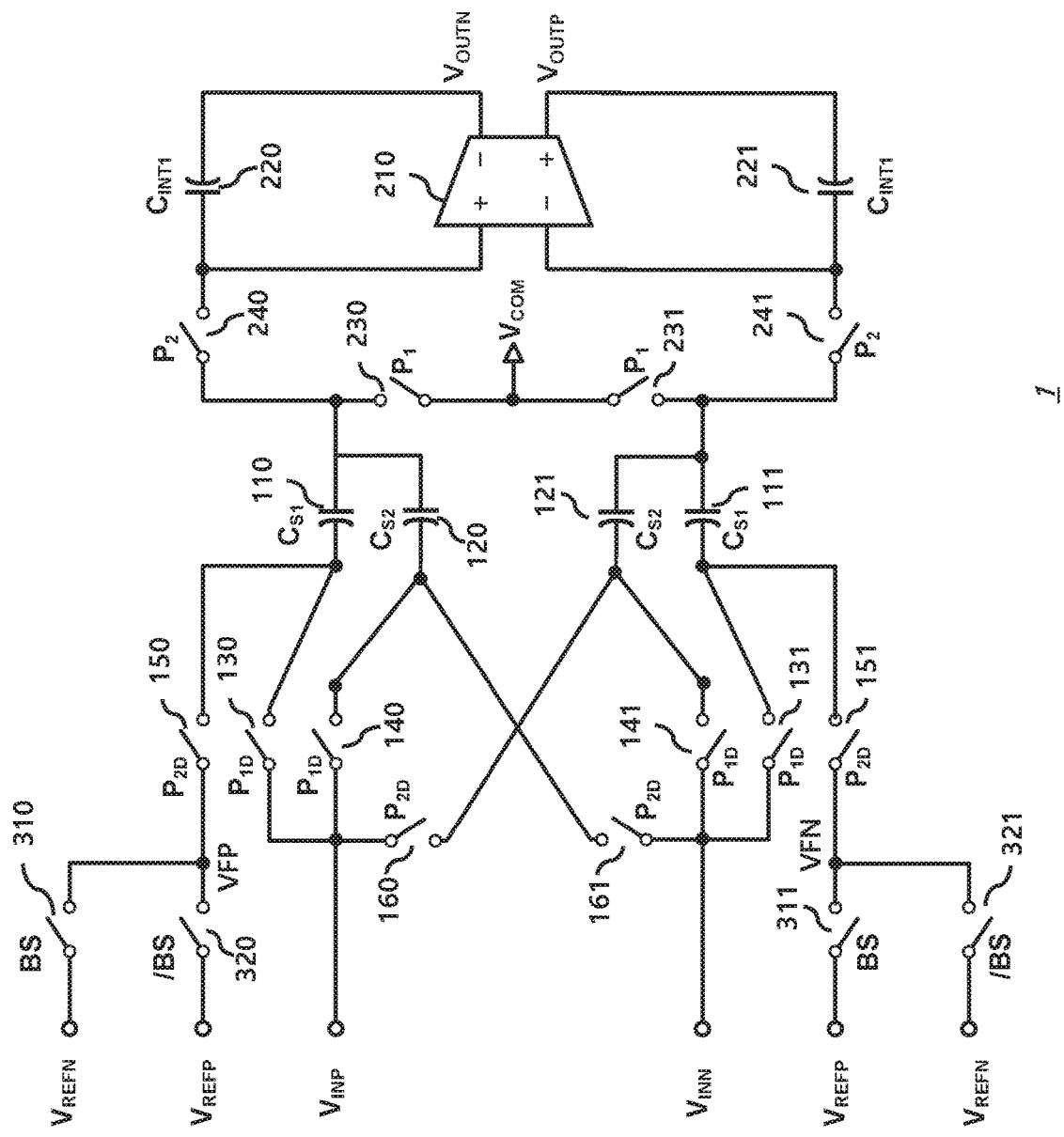
FIGS. 2 and 3 are block diagrams illustrating a delta-sigma modulator according to an embodiment of the present disclosure.

FIG. 2 is a circuit diagram of a delta-sigma modulator 1 according to an embodiment of the present disclosure.

The quantizer 400 is not illustrated in FIG. 2. The quantizer may compare an output from the integrator 300 with a reference voltage to generate the bitstream signal BS.

In this embodiment, the delta-sigma modulator 1 has a differential structure.

Figure 4:
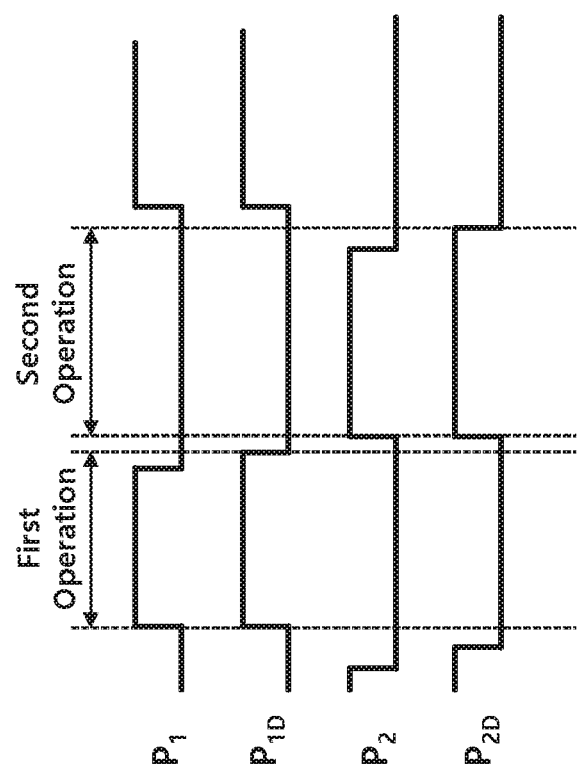
FIG. 4 is a timing diagram illustrating an operation of a delta-sigma modulator according to an embodiment of the present disclosure.

FIG. 4 is a timing diagram illustrating an operation of the delta-sigma modulator 1.

In this embodiment, the delta-sigma modulator 1 performs a first operation and a second operation alternately.

The first operation is performed when a first control signal $P_1$ or a first delay control signal $P_{1D}$ is at a high level, and the second operation is performed when a second control signal $P_2$ or a second delay control signal $P_{2D}$ is at the high level.

Rising edges of the first control signal $P_1$ and the first delay control signal $P_{1D}$ are aligned and a falling edge of the first delay control signal $P_{1D}$ is delayed from a falling edge of the first control signal $P_1$ by a predetermined time.

Rising edges of the second control signal $P_2$ and the second delay control signal $P_{2D}$ are aligned and a falling edge of the second delay control signal $P_{2D}$ is delayed from a falling edge of the second control signal $P_2$ by a predetermined time.

The rising edge of the second control signal $P_2$ occurs after a falling edge of the first delay control signal $P_{1D}$ and the rising edge of the first control signal $P_1$ occurs after a falling edge of the second delay control signal $P_{2D}$.

In FIG. 1, the quantizer 400 generates the bitstream signal BS in synchronization with the falling edge of the second control signal $P_2$.

In another embodiment, the quantizer 400 may generate the bitstream signal BS in synchronization with the falling edge of the first control signal $P_1$ or the falling edge of the second control signal $P_2$.

In this embodiment, the delta-sigma modulator 1 includes sampling capacitors 110, 120, 111, and 121, feedback capacitors 220 and 221, an operational amplifier 210, and switches 130 to 160, 131 to 161, 230, 240, 231, and 241.

In this embodiment, the delta-sigma modulator 1 includes a first sampling capacitor 110, a second sampling capacitor 120, a third sampling capacitor 111, and a fourth sampling capacitor 121.

A first input signal $V_{INP}$ is provided to a first terminal of the first sampling capacitor 110 according to the first delay control signal $P_{1D}$ and a first feedback signal $V_{FP}$ is provided to the first terminal of the first sampling capacitor 110 according to the second delay control signal $P_{2D}$.

A second input signal $V_{INN}$ is provided to a first terminal of the third sampling capacitor 111 according to the first delay control signal $P_{1D}$ and a second feedback signal $V_{FN}$ is provided to the first terminal of the third sampling capacitor 111 according to the second delay control signal $P_{2D}$.

The first input signal $V_{INP}$ is provided to a first terminal of the second sampling capacitor 120 according to the first delay control signal $P_{1D}$ and the second input signal $V_{INN}$ is provided to the first terminal of the 20th sampling capacitor 120 according to the second delay control signal $P_{2D}$.

The second input signal $V_{INN}$ is provided to a first terminal of the fourth sampling capacitor 121 according to the first delay control signal $P_{1D}$ and the first input signal $V_{INP}$ is provided to the first terminal of the fourth sampling capacitor 121 according to the second delay control signal $P_{2D}$.

The first feedback signal $V_{FP}$ corresponds to the first reference voltage $V_{REFP}$ when the bitstream signal BS is at a low level and the first feedback signal $V_{FP}$ corresponds to a second reference voltage $V_{REFN}$ that is lower than the first reference voltage $V_{REFP}$ when the bitstream signal BS is at the low level.

The second feedback signal $V_{FN}$ corresponds to the first reference voltage $V_{REFP}$ when the bitstream signal BS is at the high level and the second feedback signal $V_{FN}$ corresponds to the second reference voltage $V_{REFN}$ when the bitstream signal BS is at the low level.

A second terminal of the first sampling capacitor, a second terminal of the second sampling capacitor, a second terminal of the third sampling capacitor, and a second terminal of the fourth sampling capacitor are commonly coupled to a common voltage $V_{COM}$ according to the first control signal $P_1$. The common voltage $V_{COM}$ corresponds to an average of the first reference voltage $V_{REFP}$ and the second reference voltage $V_{RE}$FN.

The $10^{th}$ switch 130 couples the first input signal $V_{INP}$ and the first terminal of the first sampling capacitor 110 according to the first delay control signal $P_{1D}$, the $20^{th}$ switch 140 couples the first input signal $V_{INP}$ and the first terminal of the second sampling capacitor 120 according to the first delay control signal $P_{1D}$, the $11^{th}$ switch 131 couples the second input signal $V_{INN}$ and the first terminal of the third sampling capacitor 111 according to the first delay control signal $P_{1D}$, and the $21^{st}$ switch 141 couples the second input signal $V_{INN}$ and the first terminal of the fourth sampling capacitor 121 according to the first delay control signal $P_{1D}$.

The $30^{th}$ switch 150 couples the first feedback signal $V_{FP}$ and the first terminal of the first sampling capacitor 110 according to the second delay control signal $P_{2D}$, the $40^{th}$ switch 160 couples the second input signal $V_{INN}$ and the first terminal of the second sampling capacitor 120 according to the second delay control signal $P_{2D}$, the $31^{st}$ switch 151 couples the second feedback signal $V_{FN}$ and the first terminal of the third sampling capacitor 111 according to the second delay control signal $P_{2D}$, and the $41^{st}$ switch 161 couples the first input signal $V_{INP}$ and the first terminal of the fourth sampling capacitor 121 according to the second delay control signal $P_{2D}$.

The $50^{th}$ switch 310 provides the second reference voltage $V_{REFN}$ as the first feedback voltage $V_{FP}$ according to the bitstream signal BS and the $51^{st}$ switch 311 provides the first reference voltage $V_{REFP}$ as the second feedback voltage $V_{FN}$ according to the bitstream signal BS. The $60^{th}$ switch 320 provides the first reference voltage $V_{REFP}$ as the feedback voltage $V_{FP}$ according to an inverted bitstream signal /BS and the $61^{st}$ switch 321 provides the second reference voltage $V_{REFN}$ as the second feedback voltage $V_{FN}$ according to the inverted bitstream signal /BS.

The 70$^{th}$ switch 230 couples the second terminal of the first sampling capacitor 110 and the second terminal of the second sampling capacitor 120 to the common voltage $V_{COM}$ according to the first control signal $P_1$ and the 71$^{th}$ switch 231 couples the second terminal of the third sampling capacitor 111 and the second terminal of the fourth sampling capacitor 121 to the common voltage $V_{COM}$ according to the first control signal $P_1$.

Second terminals of the first sampling capacitor 110 and the second sampling capacitor 120 are coupled to a first terminal of the first feedback capacitor 220 and to a first input terminal of the operational amplifier 210 according to the second control signal P2. A second terminal of the first feedback capacitor 220 is coupled to a second output terminal of the operational amplifier 210.

The first input terminal of the operational amplifier 210 corresponds to a positive input terminal and the second output terminal of the operational amplifier 210 corresponds to a negative output terminal.

Second terminals of the third sampling capacitor 111 and the fourth sampling capacitor 121 are coupled to a first terminal of the second feedback capacitor 221 and to a second input terminal of the operational amplifier 210 according to the second control signal P2. A second terminal of the second feedback capacitor 221 is coupled to a first output terminal of the operational amplifier 210.

The second input terminal of the operational amplifier 210 corresponds to a negative input terminal and the first output terminal of the operational amplifier 210 corresponds to a positive output terminal.

The 80$^{th}$ switch 240 couples the second terminals of the first sampling capacitor 110 and the second sampling capacitor 120 to the first terminal of the first feedback capacitor 220 according to the second control signal $P_2$ and the 81$^{th}$ switch 241 couples the second terminals of the third sampling capacitor 111 and the fourth sampling capacitor 121 to the first terminal of the second feedback capacitor according to the first control signal $P_1$.

An output voltage from the first output terminal of the operational amplifier 210 may be referred as a first output voltage $V_{OUTP}$ and an output voltage from the second output terminal of the operational amplifier 210 may be referred as a second output voltage $V_{OUTN}$.

During the first operation, the first capacitor 110 is charged by the first input signal $V_{INP}$ and the third capacitor 111 is charged by the second input signal $V_{INN}$. During the second operation, the first capacitor 110 is further charged by the first feedback signal $V_{FP}$ and the third capacitor 111 is further charged by the second feedback signal $V_{FN}$. During the second operation, the operational amplifier performs filtering operation.

During the first operation, the second capacitor 120 is charged by the first input signal $V_{INP}$ and the fourth capacitor 121 is charged by the second input signal $V_{INN}$. During the second operation, the second capacitor 120 is further charged by the second input signal $V_{INN}$ and the fourth capacitor 121 is further charged by the first input signal $V_{INP}$. During the second operation, the operational amplifier performs filtering operation.

The first output voltage $V_{OUTP}$ may be represented as the following equation 1 and the second output voltage $V_{OUTN}$ may be represented as the following equation 2, where capacitance of the first capacitor 110 or the third capacitor 111 is represented as $C_{S1}$, capacitance of the second capacitor 120 or the fourth capacitor 121 is represented as $C_{S2}$, capacitance of the first feedback capacitor 220 or the second feedback capacitor 221 is represented as $C_{INT1}$, and ratio of capacitance of the second capacitor 120 over capacitance of the first capacitor 110 is represented as N($=C_{S2}/C_{S1}$).

$$V_{OUTP} = \frac{C_{S1}}{C_{INT1}}(2NV_{INP} - V_{FP} - V_{INN}) \quad \text{[Equation 1]}$$

$$V_{OUTN} = \frac{C_{S1}}{C_{INT1}}(2NV_{INN} - V_{FN} - V_{INP}) \quad \text{[Equation 2]}$$

A relation between a differential output signal $V_{OUT,DIFF}$ and a differential input signal $V_{IN,DIFF}$ may be represented as the following equation 3 from equations 1 and 2.

$$V_{OUT,DIFF} = \frac{C_{S1}}{C_{INT1}}((2N+1)V_{IN,DIFF} - V_{F,DIFF}) \quad \text{[Equation 3]}$$

In equation 3, the differential output signal $V_{OUT,DIFF}$ corresponds to $V_{OUTP}-V_{OUTN}$, the differential input signal $V_{IN,DIFF}$ equals to $V_{INP}-V_{INN}$, and the differential feedback signal $V_{F,DIFF}$ corresponds to $V_{FP}-V_{FN}$.

As shown in equation 3, the differential output signal $V_{OUT,DIFF}$ corresponds to (2N+1) times of the differential input signal $V_{IN,DIFF}$.

Therefore, additional amplifier is not necessary though the analog signal A is minute.

Additional integrator circuit may be included between the operational amplifier 210 and the quantizer 400. Detailed description and drawings thereof are omitted because they are obvious from the above disclosure.

Figure 3:
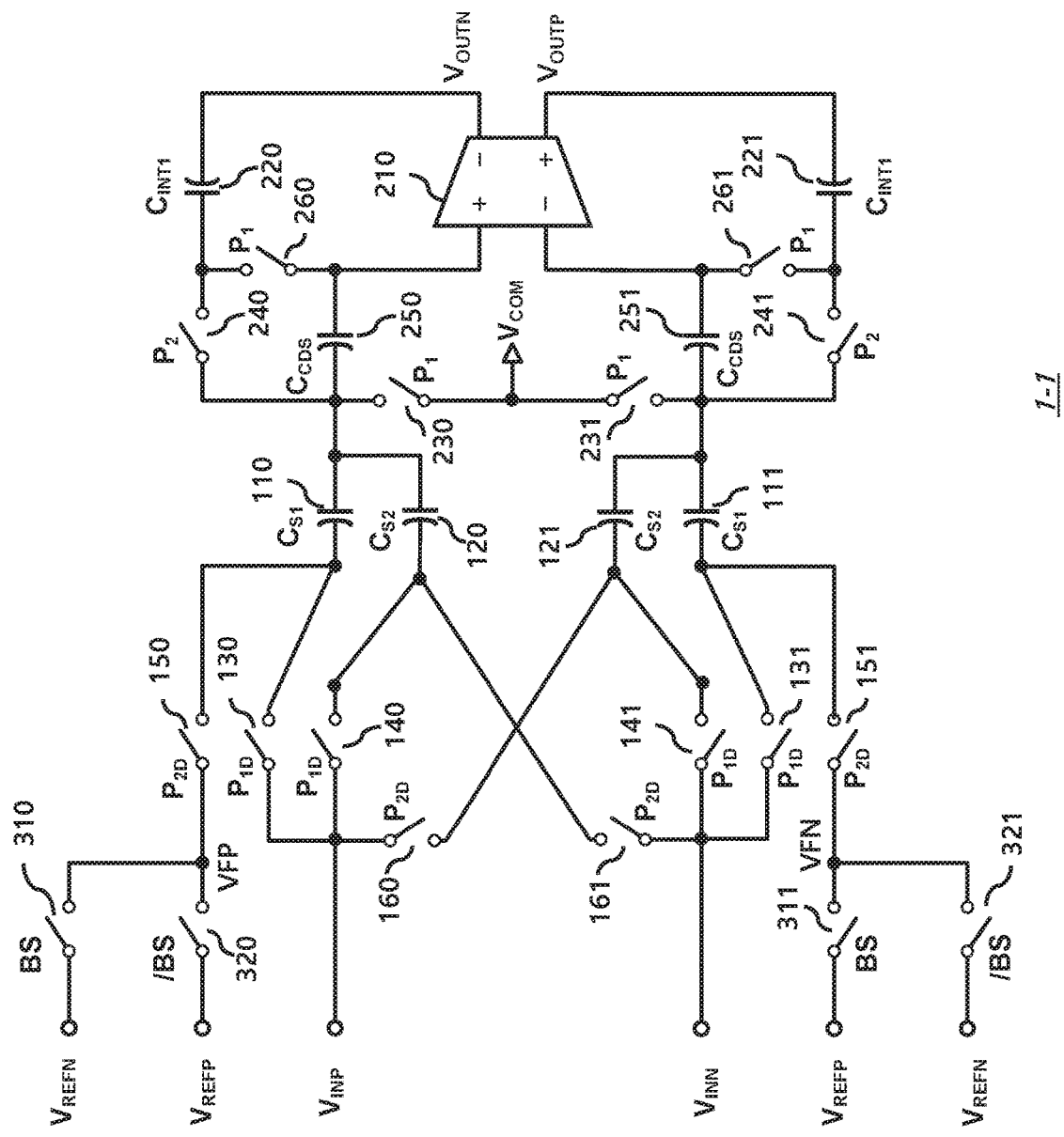

FIG. 3 is a block diagram of a delta-sigma modulator 1-1 according to another embodiment of the present disclosure.

The embodiment of FIG. 3 applies a correlated double sampling (CDS) technique to solve offset problem existing in the operational amplifier 210.

In this embodiment, the sigma-delta modulator 1-1 further includes a first CDS capacitor 250, a second CDS capacitor 251, a 90$^{th}$ switch 260, and a 91$^{st}$ switch 261.

The first CDS capacitor 250 is coupled between the second terminal of the first sampling capacitor 110 and the first input terminal of the operational amplifier 210, and the second CDS capacitor 251 is coupled between the second terminal of the third sampling capacitor 111 and the second input terminal of the operational amplifier 210.

The 90$^{th}$ switch 260 is coupled between the first input terminal of the operational amplifier 210 and the first terminal of the first feedback capacitor 220, and the 91$^{st}$ switch 261 is coupled between the second input terminal of the operational amplifier 210 and the first terminal of the second feedback capacitor 221.

The 90$^{th}$ switch 260 and the 91$^{st}$ switch 261 are turned on when the first control signal $P_1$ is at the high level.

During the first operation, the first CDS capacitor 250 is coupled between the first input terminal of the operational amplifier and the common voltage $V_{COM}$ and the first CDS capacitor 250 is coupled between the first terminal of the first feedback capacitor 220 and the common voltage $V_{COM}$.

During the first operation, the second CDS capacitor 251 is coupled between the second input terminal of the operational amplifier 210 and the common voltage $V_{COM}$ and the second CDS capacitor 251 is coupled between the first terminal of the second feedback capacitor 221 and the common voltage $V_{COM}$.

Accordingly, charges corresponding to offset component of the operational amplifier 210 are charged to the first and second CDS capacitors 250 and 251 during the first operation.

During the second operation, the $90^{th}$ switch 260 and the $91^{st}$ switch 261 are turned off and the $80^{th}$ switch and the $81^{st}$ switch are turned on so that integration operation is performed according to charges charged in the first CDS capacitor 250 and the second CDS capacitor 251.

Through this operation, the integration operation may be performed in a direction to cancel offset component of the operational amplifier 210.

Other operations are substantially the same as the embodiment shown in FIG. 2, and therefore repeated descriptions are omitted.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A delta-sigma modulator generating a bitstream signal from a differential input signal including a first input signal and a second input signal by repeating a first operation and a second operation alternately, the delta-sigma modulator comprising:
    a first sampling capacitor including a first terminal coupled to a first input signal during the first operation and coupled to a first feedback signal during the second operation;
    a second sampling capacitor including a first terminal coupled to the first input signal during the first operation and coupled to a second input signal during the second operation;
    a third sampling capacitor including a first terminal coupled to the second input signal during the first operation and coupled to a second feedback signal during the second operation;
    a fourth sampling capacitor including a first terminal coupled to the second input signal during the first operation and coupled to the first input signal during the second operation;
    an operational amplifier including a first input terminal commonly coupled to a second terminal of the first sampling capacitor and a second terminal of the second sampling capacitor during the second operation and a second input terminal coupled to a second terminal of the third sampling capacitor and a second terminal of the fourth sampling capacitor during the second operation;
    a first feedback capacitor coupled between the first input terminal and a second output terminal;
    a second feedback capacitor coupled between the second input terminal and a first output terminal; and
    a quantizer configured to generate the bitstream signal from signals from the first output terminal and the second output terminal.

2. The delta-sigma modulator of claim 1, wherein the first feedback signal corresponds to a first reference voltage when the bitstream signal is at a low level and to a second reference voltage smaller than the first reference voltage when the bitstream signal is at a high level, and wherein the second feedback signal corresponds to the first reference voltage when the bitstream signal is at the high level and to the second reference voltage when the bitstream signal is at the low level.

3. The delta-sigma modulator of claim 2, wherein a second terminal of the first sampling capacitor, a second terminal of the second sampling capacitor, a second terminal of the third sampling capacitor and a second terminal of the fourth sampling capacitor are commonly coupled to a common voltage during the first operation, and wherein the common voltage corresponds to an average of the first reference voltage and the second reference voltage.

4. The delta-sigma modulator of claim 3, further comprising a first correlated double sampling (CDS) capacitor including a first terminal coupled to the common voltage and a second terminal coupled to the first input terminal during the first operation and a second CDS capacitor including a first terminal coupled to the common voltage and a second terminal coupled to the second input terminal during the first operation.

5. The delta-sigma modulator of claim 4, the first input terminal is coupled to a first terminal of the first feedback capacitor and the second input terminal is coupled to a first terminal of the second feedback capacitor during the first operation.

6. The delta-sigma modulator of claim 1, the quantizer updates the bitstream signal when the first operation or the second operation finishes.

7. The delta-sigma modulator of claim 1, further comprising an integrator that integrates output signal from the operational amplifier and provides an output of the integrator to the quantizer.

8. An analog-to-digital converter (ADC) comprising:
    a delta-sigma modulator configured to generate a bitstream signal from a differential input signal including a first input signal and a second input signal by repeating a first operation and a second operation alternately; and
    a decimation filter configured to generate a digital signal corresponding to the differential input signal by filtering the bitstream signal, wherein the delta-sigma modulator includes:
    a first sampling capacitor including a first terminal coupled to a first input signal during the first operation and coupled to a first feedback signal during the second operation;
    a second sampling capacitor including a first terminal coupled to the first input signal during the first operation and coupled to a second input signal during the second operation;
    a third sampling capacitor including a first terminal coupled to the second input signal during the first operation and coupled to the second feedback signal during the second operation;
    a fourth sampling capacitor including a first terminal coupled to the second input signal during the first operation and coupled to the first input signal during the second operation;
    an operational amplifier including a first input terminal commonly coupled to a second terminal of the first sampling capacitor and a second terminal of the second sampling capacitor during the second operation and a second input terminal coupled to a second terminal of the third sampling capacitor and a second terminal of the fourth sampling capacitor during the second operation;
    a first feedback capacitor coupled between the first input terminal and a second output terminal;
    a second feedback capacitor coupled between the second input terminal and a first output terminal; and a quantizer configured to generate the bitstream signal from signals from the first output terminal and the second output terminal.

9. The ADC of claim 8, wherein the first feedback signal corresponds to a first reference voltage when the bitstream signal is at a low level and to a second reference voltage smaller than the first reference voltage when the bitstream signal is at a high level, and wherein the second feedback signal corresponds to the first reference voltage when the bitstream signal is at the high level and to the second reference voltage when the bitstream signal is at the low level.

10. The ADC of claim 9, wherein a second terminal of the first sampling capacitor, a second terminal of the second sampling capacitor, a second terminal of the third sampling capacitor and a second terminal of the fourth sampling capacitor are commonly coupled to a common voltage during the first operation, and wherein the common voltage corresponds to an average of the first reference voltage and the second reference voltage.

11. The ADC of claim 10, further comprising a first CDS capacitor including a first terminal coupled to the common voltage and a second terminal coupled to the first input terminal during the first operation and a second CDS capacitor including a first terminal coupled to the common voltage and a second terminal coupled to the second input terminal during the first operation.

12. The ADC of claim 11, the first input terminal is coupled to a first terminal of the first feedback capacitor and the second input terminal is coupled to a first terminal of the second feedback capacitor during the first operation.

13. The ADC of claim 8, the quantizer updates the bitstream signal when the first operation or the second operation finishes.

14. The ADC of claim 8, further comprising an integrator that integrates output signal from the operational amplifier and provides an output of the integrator to the quantizer.

* * * * *